United States Patent
Hirasaki

(10) Patent No.: US 12,198,934 B2
(45) Date of Patent: Jan. 14, 2025

(54) MULTILAYER SEMICONDUCTOR STRUCTURE, SEMICONDUCTOR DEVICE, AND METHOD FOR MANUFACTURING MULTILAYER SEMICONDUCTOR STRUCTURE

(71) Applicant: SUMITOMO ELECTRIC INDUSTRIES, LTD., Osaka (JP)

(72) Inventor: Takahide Hirasaki, Osaka (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 0 days.

(21) Appl. No.: 17/655,405

(22) Filed: Mar. 18, 2022

(65) Prior Publication Data

US 2022/0328321 A1 Oct. 13, 2022

(30) Foreign Application Priority Data

Apr. 9, 2021 (JP) ................................. 2021-066252

(51) Int. Cl.
| | | |
|---|---|---|
| H01L 29/20 | (2006.01) | |
| H01L 21/02 | (2006.01) | |
| H01L 21/306 | (2006.01) | |
| H01L 29/06 | (2006.01) | |
| H01L 29/08 | (2006.01) | |

(52) U.S. Cl.
CPC .. *H01L 21/30621* (2013.01); *H01L 21/02304* (2013.01); *H01L 21/0237* (2013.01); *H01L 21/02494* (2013.01); *H01L 21/0254* (2013.01); *H01L 29/0649* (2013.01); *H01L 29/0847* (2013.01); *H01L 29/2003* (2013.01)

(58) Field of Classification Search
None
See application file for complete search history.

(56) References Cited

U.S. PATENT DOCUMENTS

| | | | |
|---|---|---|---|
| 5,814,239 A | 9/1998 | Kaneko et al. | |
| 2008/0113496 A1 | 5/2008 | Keller et al. | |
| 2010/0320505 A1* | 12/2010 | Okamoto | H01L 29/41766 438/168 |
| 2011/0233519 A1* | 9/2011 | Cheng | H01L 21/0242 257/15 |
| 2014/0326950 A1* | 11/2014 | Shatalov | H01L 29/0657 257/18 |
| 2015/0144953 A1* | 5/2015 | Hill | H01L 29/7787 438/172 |

(Continued)

FOREIGN PATENT DOCUMENTS

| | | |
|---|---|---|
| JP | H09-045670 | 2/1997 |
| JP | 2013-100227 | 5/2013 |
| JP | 2020-136683 | 8/2020 |

OTHER PUBLICATIONS

K. Hiramatsu et al., Fabrication and characterization of low defect density GaN using facet-controlled epitaxial lateral overgrowth (FACELO), Journal of Crystal Growth 221 (2000) 316-326.

*Primary Examiner* — Grant S Withers
(74) *Attorney, Agent, or Firm* — IPUSA, PLLC

(57) ABSTRACT

A multilayer semiconductor structure of the present disclosure includes a substrate a buffer layer disposed on the substrate and a semiconductor layer disposed on the buffer layer. A void is provided between the buffer layer and the semiconductor layer.

8 Claims, 10 Drawing Sheets

(56) References Cited

U.S. PATENT DOCUMENTS

2019/0334023 A1* 10/2019 Nakata ................ H01L 29/2003
2020/0273974 A1* 8/2020 Guidry ................ H01L 29/7786
2022/0115520 A1* 4/2022 Li ....................... H01L 29/0649

* cited by examiner

100 μm

100 μm

MULTILAYER SEMICONDUCTOR STRUCTURE, SEMICONDUCTOR DEVICE, AND METHOD FOR MANUFACTURING MULTILAYER SEMICONDUCTOR STRUCTURE

CROSS REFERENCE TO RELATED APPLICATIONS

This application claims priority to Japanese Patent Application No. 2021-066252 filed on Apr. 9, 2021, and the entire contents of the Japanese patent application are incorporated herein by reference.

TECHNICAL FIELD

The present disclosure relates to a multilayer semiconductor structure, a semiconductor device, and a method of manufacturing a multilayer semiconductor structure.

BACKGROUND ART

With respect to a multilayer semiconductor structure used for a nitride semiconductor device or the like, various techniques for obtaining a front surface having good properties have been proposed (see, the following documents).
[Patent Document 1] Japanese Unexamined Patent Application Publication No. 09-45670
[Patent Document 2] Japanese Unexamined Patent Application Publication No. 2013-100227
[Patent Document 3] Japanese Unexamined Patent Application Publication No. 2020-136683
[Non-Patent Document 1] K. Hiramatsu et al., J. Cryst. Growth, 221, 316 (2000)

SUMMARY OF THE INVENTION

A multilayer semiconductor structure of the present disclosure includes a substrate a buffer layer disposed on the substrate and a semiconductor layer disposed on the buffer layer. A void is provided between the buffer layer and the semiconductor layer.

DETAILED DESCRIPTION OF THE INVENTION

Figure 1:
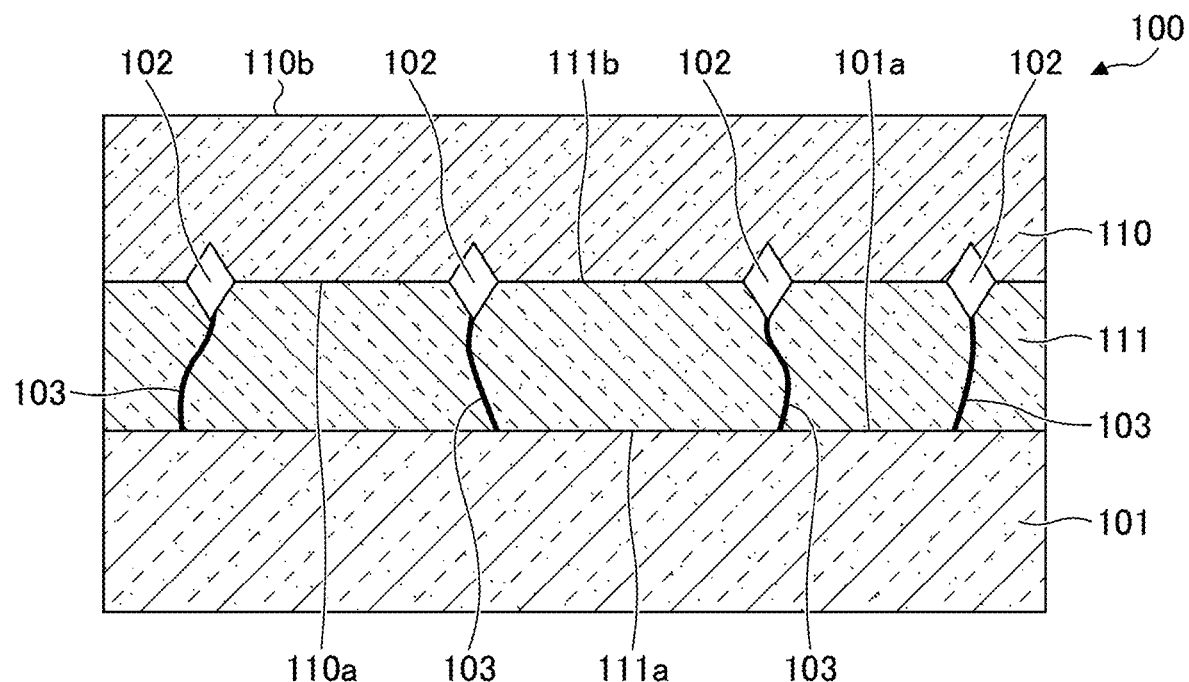
FIG. 1 is a cross-sectional view illustrating a multilayer semiconductor structure according to a first embodiment.

In a conventional multilayer semiconductor structure, it is difficult to inhibit the formation of hillocks (hemispherical protrusions) on a front surface of a semiconductor layer. By forming a thick buffer layer or the like, the number of dislocations can be reduced and the formation of hillocks can be inhibited. In this case, the characteristics of a semiconductor device may deteriorate due to an influence of the thick buffer layer or the like.

It is an object of the present disclosure to provide a multilayer semiconductor structure, a semiconductor device, and a method for manufacturing a multilayer semiconductor structure with capable of inhibiting the formation of hillocks.

DESCRIPTION OF EMBODIMENTS OF THE PRESENT DISCLOSURE

First, embodiments of the present disclosure will be listed and described.

[1] A multilayer semiconductor structure according to an embodiment of the present disclosure includes a substrate a buffer layer disposed on the substrate and a semiconductor layer disposed on the buffer layer. A void is provided between the buffer layer and the semiconductor layer.

Because the void is provided between the buffer layer and the semiconductor layer, even if a dislocation is included in the buffer layer, a propagation of the dislocation to the semiconductor layer can be inhibited.
Therefore, a crystallinity of the semiconductor layer is improved, and the formation of hillocks on a front surface of the semiconductor layer can be inhibited.

[2] In [1], the buffer layer may include a dislocation connected to the void. In this case, it is possible to inhibit a propagation of the dislocation connected to the void to the semiconductor layer.

[3] In [2], the dislocation may be a screw dislocation or a mixed dislocation. In this case, since the screw dislocation or the mixed dislocation is more likely to form the void than an edge dislocation, the propagation of the screw dislocation or the mixed dislocation to the semiconductor layer is more likely to be inhibited.

[4] In [1] to [3], the buffer layer may be an AlN layer.

In this case, a chemically stable buffer layer is obtained. In addition, because AlN is a binary material, it is easy to form the buffer layer.

[5] In [1] to [4], the semiconductor layer may include a nitride semiconductor layer having a first surface facing the substrate and a second surface opposite to the first surface, and the second surface is N-polar. In this case, a nitride semiconductor device using N-polar can be easily formed.

[6] A semiconductor device according to another embodiment of the present disclosure includes the multilayer semiconductor structure according to any one of (1) to (5) and gate, source, and drain electrodes formed on the multilayer semiconductor structure. In this case, the semiconductor device in which the formation of hillocks on a front surface of the semiconductor layer are inhibited can be obtained.

[7] In [6], the semiconductor layer may include a barrier layer disposed on the buffer layer and a channel layer disposed above the barrier layer. In this case, the source electrode and the drain electrode are easily disposed in a vicinity of a channel region in a channel layer, and the resistance between the source electrode and the channel region and the resistance between the drain electrode and the channel region are easily reduced.

[8] A method for manufacturing a multilayer semiconductor structure according to another embodiment of the present disclosure includes the steps of forming a buffer layer on a substrate, etching a surface of the buffer layer to form an etch pit in the surface and forming a semiconductor layer on the buffer layer while forming a void including the etch pit between the buffer layer and the semiconductor layer.

Because the semiconductor layer is formed while forming the void including the etch pit between the buffer layer and the semiconductor layer, even if the dislocation is included in the buffer layer, it is possible to inhibit the propagation of the dislocation to the semiconductor layer.
Therefore, the crystallinity of the semiconductor layer is improved, and the formation of hillocks on the front surface of the semiconductor layer can be inhibited.

[9] In [8], the buffer layer may be an AlN layer, and the surface of the buffer layer is etched with an etchant including chlorine gas. In this case, the etch pit is easily formed.

DETAILS OF EMBODIMENTS OF THE PRESENT DISCLOSURE

Hereinafter, embodiments of the present disclosure will be described in detail, but the present disclosure is not limited thereto. In the specification and the drawings, components having substantially the same functional configuration are denoted by the same reference numerals, and redundant description thereof may be omitted.

First Embodiment

First, a first embodiment will be described. The first embodiment relates to a multilayer semiconductor structure. FIG. 1 is a cross-sectional view illustrating a multilayer semiconductor structure according to a first embodiment.

As illustrated in FIG. 1, a multilayer semiconductor structure 100 according to the first embodiment includes a substrate 101, a buffer layer 111 disposed on substrate 101, and a semiconductor layer 110 disposed on buffer layer 111.

Substrate 101 is, for example, substrate for growing a GaN-based semiconductor. Substrate 101 is, for example, a semi-insulating SiC substrate. When substrate 101 is a SiC substrate, a front surface 101a of substrate 101 is a carbon (C) polar surface. When front surface 101a of substrate 101 is a carbon surface, buffer layer 111 and semiconductor layer 110 can be grown using a nitrogen (N) polar surface as a growth surface. A sapphire substrate may be used as the substrate for growing a GaN-based semiconductor. Further, substrate 101 may not be substrate for crystal growth. In this case, the substrate may be removed from buffer layer 111 and semiconductor layer 110 grown on another substrate, and substrate 101 may be bonded to buffer layer 111 and semiconductor layer 110. In this case, a semi-insulating substrate made of various materials may be used as substrate 101, and for example, a sapphire substrate, a Si substrate, a SiC substrate, an AlN substrate, a sintered body, or the like may be used.

Buffer layer 111 is a layer epitaxially grown on substrate 101 and is, for example, an AlN layer. The thickness of buffer layer 111 is, for example, 5 nm to 50 nm. On the carbon surface of the SiC substrate, buffer layer 111 is crystal-grown using an N-polar surface as a growth surface. Therefore, a front surface 111b of buffer layer 111 opposite to substrate 101 is an N-polar surface, and a back surface 111a of buffer layer 111 facing substrate 101 is a gallium (Ga)-polar surface.

Buffer layer 111 may include a dislocation 103. The density of dislocations 103 in front surface 111b of buffer layer 111 is, for example, $1\times10^8$ cm$^{-2}$ to $1\times10^{12}$ cm$^{-2}$. Dislocation 103 is, for example, a screw dislocation, an edge dislocation, or a mixed dislocation.

Semiconductor layer 110 is a layer epitaxially grown on buffer layer 111 and is, for example, a nitride semiconductor layer. Semiconductor layer 110 is, for example, a GaN layer, an AlN layer, an AlGaN layer, an InAlN layer, an InGaN layer, or an InAlGaN layer. Semiconductor layer 110 has a back surface 110a in contact with buffer layer 111, and back surface 110a is a Ga-polar surface. Semiconductor layer 110 has a front surface 110b opposite to buffer layer 111 (i.e. opposite to substrate 101), and front surface 110b is an N-polar surface. Back surface 110a is an example of a first surface, and front surface 110b is an example of a second surface.

A void 102 is formed between buffer layer 111 and semiconductor layer 110. A plurality of voids 102 may be formed. Void 102 is connected to any of the dislocations 103. Dislocation 103 connected to void 102 is mainly screw dislocation or mixed dislocation. Some voids 102 may be connected to screw dislocations, and some other voids 102 may be connected to mixed dislocations. Further some other voids 102 may be connected to edge dislocations.

The density of the dislocation on front surface 110b and back surface 110a of semiconductor layer 110 are lower than that of dislocation 103 on front surface 111b of buffer layer 111, for example, less than $1\times10^9$ cm$^{-2}$, preferably $1\times10^7$ cm$^{-2}$ or less, and more preferably, semiconductor layer 110 does not substantially include dislocations.

Figure 2:
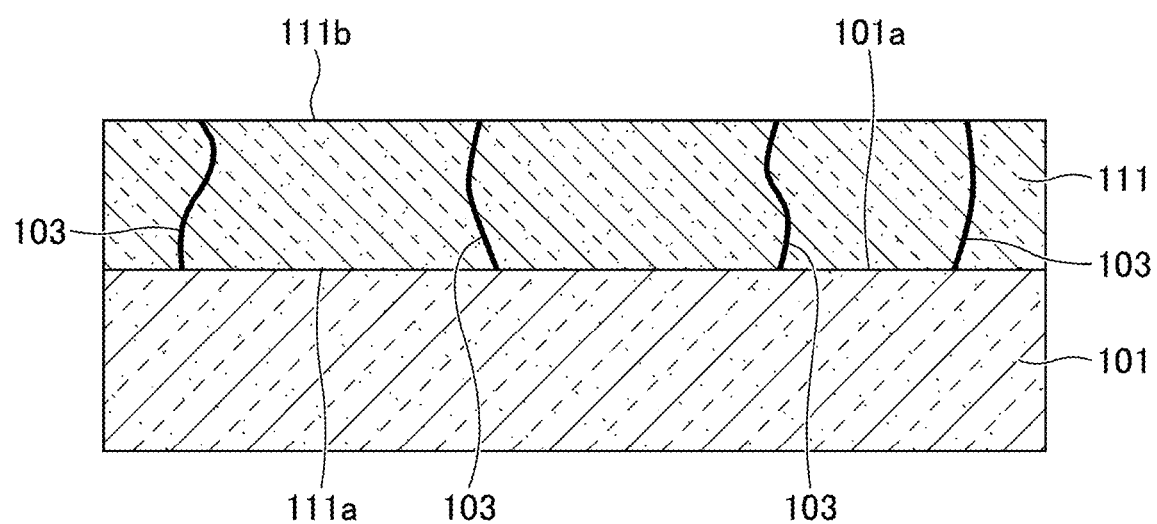
FIG. 2 is a first cross-sectional view for illustrating a method for manufacturing the multilayer semiconductor structure according to the first embodiment.
Figure 3:
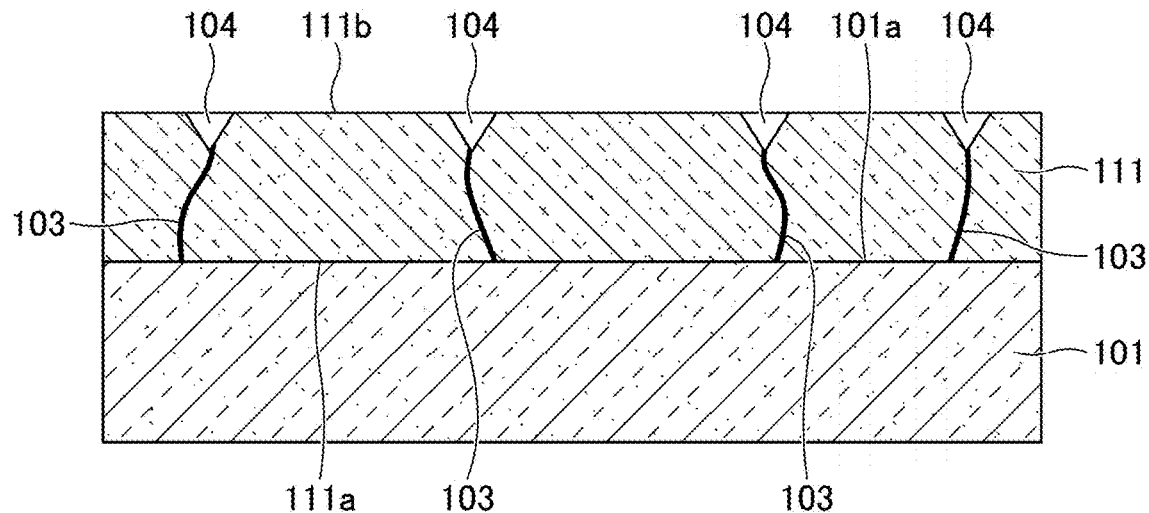
FIG. 3 is a second cross-sectional view for illustrating the method for manufacturing the multilayer semiconductor structure according to the first embodiment.
Figure 4:
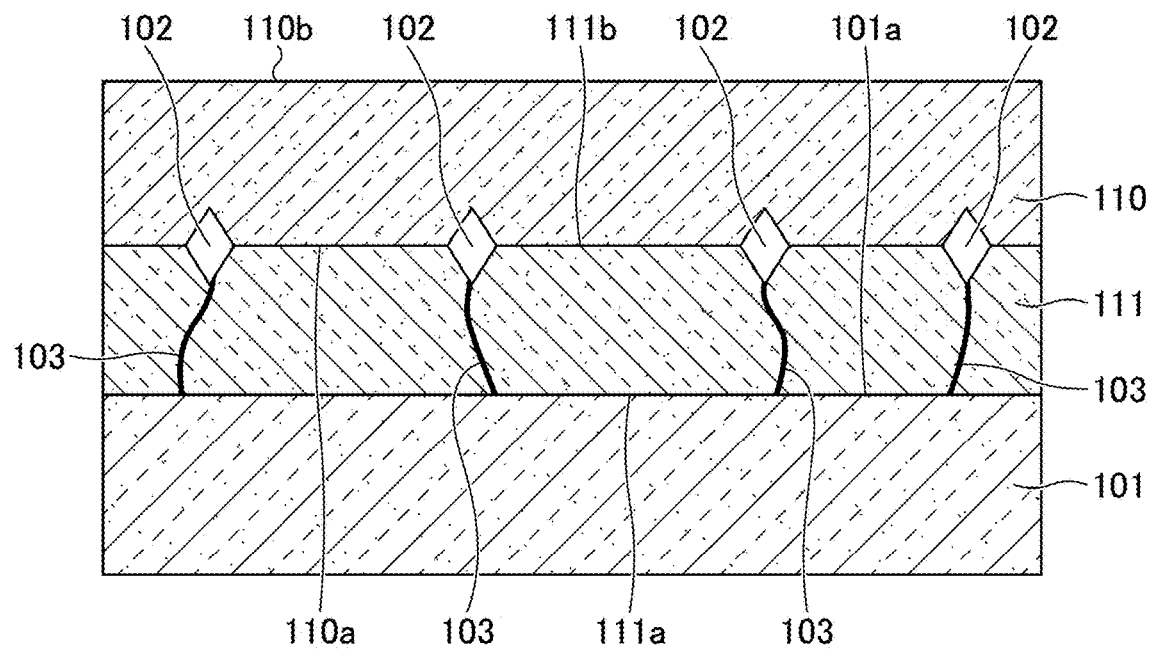
FIG. 4 is a third cross-sectional view for illustrating the method for manufacturing the multilayer semiconductor structure according to the first embodiment.

Next, a method for manufacturing the multilayer semiconductor structure according to the first embodiment will be described. FIGS. 2 to 4 are cross-sectional views illustrating the method for manufacturing the multilayer semiconductor structure according to the first embodiment.

First, as illustrated in FIG. 2, buffer layer 111 is disposed on front surface 101a of substrate 101 by, for example, a metal organic chemical vapor deposition (MOCVD) method. Source gases of buffer layer 111 are, for example, trimethylaluminum (TMA) and ammonia (NH$_3$). Dislocation 103 is inevitably included in buffer layer 111 due to the influence of a crystal mismatch or the like with substrate 101.

Next, as illustrated in FIG. 3, front surface 111b of buffer layer 111 is etched to form an etch pit 104 in a portion where dislocation 103 is exposed to front surface 111b. In this etching, for example, the temperature of substrate 101 and buffer layer 111 is set to 1000° C. or higher, and an etchant containing a chlorine ($Cl_2$) gas is used. For example, a $Cl_2$ gas diluted with a nitrogen ($N_2$) gas may be used as the etchant.

Next, as illustrated in FIG. 4, semiconductor layer 110 is disposed on front surface 111b of buffer layer 111. The source gas for semiconductor layer 110 may be selected according to the composition of semiconductor layer 110. TMG (trimethylgallium) can be used when semiconductor layer 110 contains Ga; TMA can be used when semiconductor layer 110 contains Al; and TMI (trimethylindium) can be used when semiconductor layer 110 contains In. $NH_3$ can be used as a raw material of N. Semiconductor layer 110 is preferentially grown from the periphery of etch pit 104. Semiconductor layer 110 is grown not only in a thickness direction (vertical direction) of buffer layer 111 but also in a parallel direction (horizontal direction) to front surface 111b. Therefore, semiconductor layer 110 is grown while forming void 102 including etch pit 104 between buffer layer 111 and semiconductor layer 110.

In this way, multilayer semiconductor structure 100 according to the first embodiment can be manufactured.

In the first embodiment, because void 102 is formed between buffer layer 111 and semiconductor layer 110, even if dislocation 103 is included in buffer layer 111, the propagation of dislocation 103 to semiconductor layer 110 can be inhibited. Therefore, the crystallinity of semiconductor layer 110 can be improved, and the formation of hillocks on front surface 110b of semiconductor layer 110 can be inhibited.

Further, buffer layer 111 may include dislocation 103 connected to void 102. In this case, the propagation of dislocation 103 connected to void 102 to semiconductor layer 110 can be inhibited. Dislocation 103 may be a screw dislocation or a mixed dislocation. Because the screw dislocation or the mixed dislocation is more likely to form void 102 than the edge dislocation, the propagation of the screw dislocation or the mixed dislocation to semiconductor layer 110 is more likely to be inhibited.

When buffer layer 111 is an AlN layer, a chemically stable buffer layer 111 is obtained. In addition, because AlN is a binary material, it is easy to form buffer layer 111.

When semiconductor layer 110 includes a nitride semiconductor layer having back surface 110a on the substrate and front surface 110b opposite to back surface 110a, and the polarity of front surface 110b is N-polar, a nitride semiconductor device using N-polar can be easily configured.

When semiconductor layer 110 is formed, a condition under which semiconductor layer 110 easily grows in the horizontal direction may be employed until etch pit 104 is closed and void 102 is formed and a condition under which semiconductor layer 110 easily grows in the vertical direction may be employed after void 102 is formed. By changing the growth conditions in this way, it is easy to improve productivity.

Second Embodiment

Figure 5:
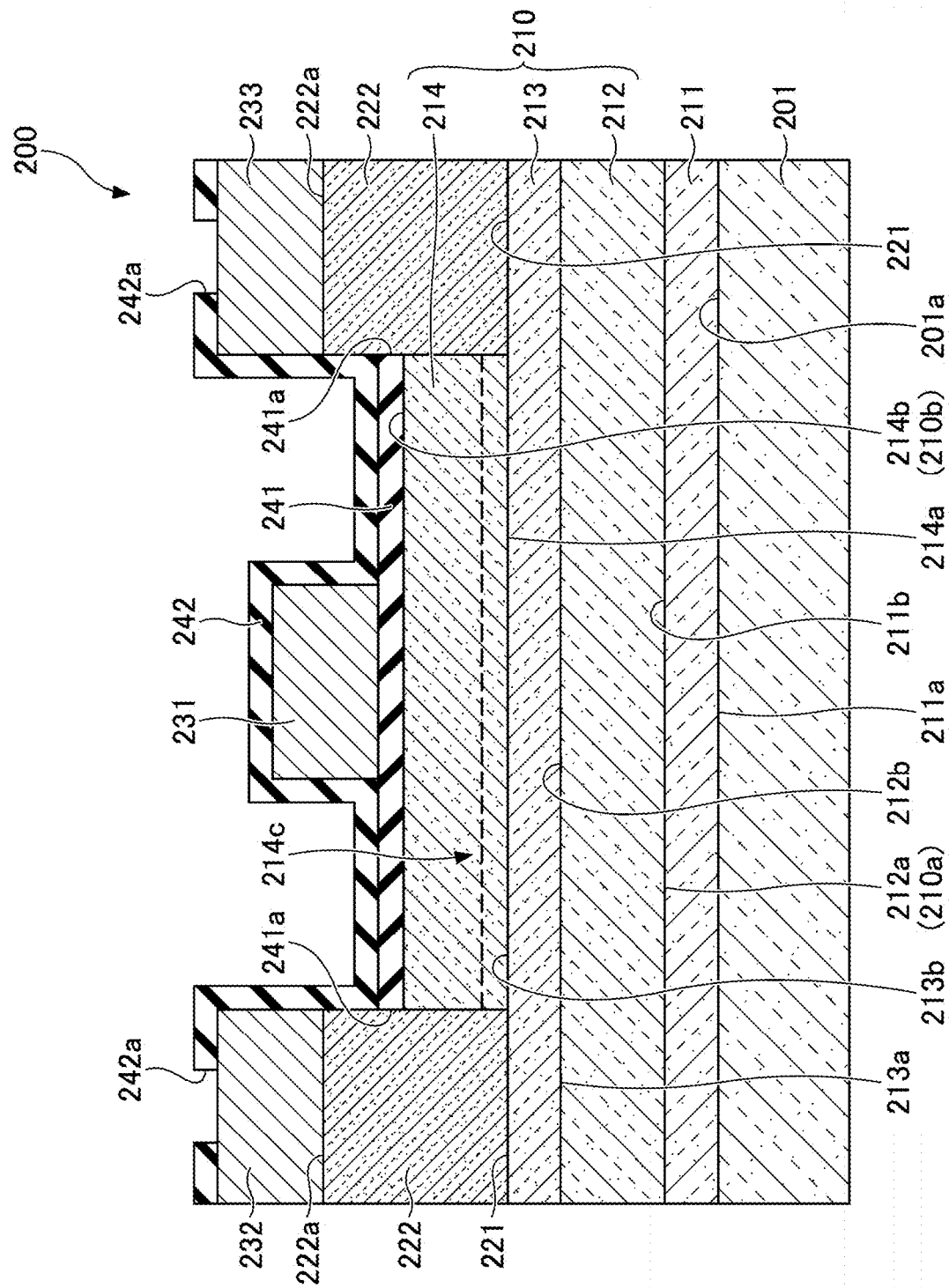
FIG. 5 is a cross-sectional view for illustrating a semiconductor device according to a second embodiment.

Next, a second embodiment will be described. The second embodiment relates to the semiconductor device including a high electron mobility transistor (HEMT). FIG. 5 is a cross-sectional view illustrating semiconductor device according to the second embodiment. A semiconductor device 200 according to the second embodiment has a structure as a so-called reverse HEMT.

As illustrated in FIG. 5, semiconductor device 200 includes a substrate 201, a buffer layer 211 disposed on substrate 201, a semiconductor layer 210 disposed on buffer layer 211, and a gate electrode 231, a source electrode 232, and a drain electrode 233 formed on semiconductor layer 210. Semiconductor device 200 further includes a SiN layer 241 disposed between gate electrode 231 and semiconductor layer 210, and an insulating layer 242 disposed on SiN layer 241 and covering gate electrode 231. The reverse HEMT may be used at a high frequency such as for an E-band or a W-band. In particular, the E-band is expected to be applied to inter-station communication or the like of mobile phones.

Substrate 201 is, for example, a substrate for growing a GaN-based semiconductor, and in one example, is a semi-insulating SiC substrate. When substrate 201 is a SiC substrate, a front surface 201a of substrate 201 is a carbon (C) polar surface. When front surface 201a of substrate 201 is a carbon surface, buffer layer 211 and semiconductor layer 210 can be grown using a nitrogen (N) polar surface as a growth surface. A sapphire substrate may be used as the substrate for growing a GaN-based semiconductor. Further, substrate 201 may not be the substrate for crystal growth. In this case, the substrate may be removed from buffer layer 211 and semiconductor layer 210 grown on another substrate, and substrate 201 may be bonded to buffer layer 211 and semiconductor layer 210. In this case, a semi-insulating substrate made of various materials may be used as substrate 201, and for example, a sapphire substrate, a Si substrate, a SiC substrate, an AlN substrate, a sintered body, or the like may be used.

Buffer layer 211 is a layer epitaxially grown on substrate 201 and is, for example, an AlN layer. On the carbon surface of the SiC substrate, buffer layer 211 is crystal-grown using the N-polar surface as a growth surface. Therefore, a front surface 211b of buffer layer 211 opposite to substrate 201 is an N-polar surface, and a back surface 211a of buffer layer 211 on substrate 201 side is a gallium (Ga) polar surface. The thickness of buffer layer 211 is, for example, 5 nm to 50 nm.

Semiconductor layer 210 mainly includes a nitride semiconductor (in particular, a GaN-based semiconductor). For example, semiconductor layer 210 includes an AlGaN barrier layer 212 (or an InAlN barrier layer), an AlN layer 213, and a GaN channel layer 214 disposed on buffer layer 211 in this order.

AlGaN barrier layer 212 is an AlGaN layer epitaxially grown on buffer layer 211 and functions as a barrier layer (electron supply layer). The band gap of AlGaN barrier layer 212 is larger than that of GaN channel layer 214 described later. AlGaN barrier layer 212 has a back surface 212a in contact with buffer layer 211, and back surface 212a is a Ga polar surface. Back surface 212a constitutes a back surface 210a of semiconductor layer 210 that faces substrate 201. AlGaN barrier layer 212 has a front surface 212b opposite to buffer layer 211 (i.e. opposite to substrate 201), and front surface 212b is an N-polar surface. The thickness of AlGaN barrier layer 212 is, for example, 20 nm to 40 nm, and is 30 nm in one embodiment. When AlGaN barrier layer 212 is an $Al_xGa_{1-x}N$ layer, the Al composition x thereof is, for example, 0.15 to 0.40, and is 0.25 in one embodiment. The conductivity type of AlGaN barrier layer 212 is, for example, n-type or undoped (i-type). Note that an InAlN barrier layer may be used instead of AlGaN barrier layer 212. Back surface 210a is an example of a first surface.

AlN layer 213 is a layer epitaxially grown on AlGaN barrier layer 212, and is disposed between AlGaN barrier layer 212 and GaN channel layer 214. AlN layer 213 functions as an etching stop layer for GaN channel layer 214 when semiconductor layer 210 is etched. That is, AlN layer 213 has a higher etching resistance than GaN channel layer 214. AlN layer 213 has a back surface 213a in contact with front surface 212b of AlGaN barrier layer 212, and back surface 213a is a Ga-polar surface. Further, AlN layer 213 has a front surface 213b opposite to AlGaN barrier layer 212 (i.e. opposite to substrate 201), and front surface 213b is an N-polar surface. The thickness of AlN layer 213 are, for example, 0.3 nm to 2.0 nm, and in one embodiment 0.5 nm.

GaN channel layer 214 is disposed above AlGaN barrier layer 212. GaN channel layer 214 is disposed on AN layer 213. GaN channel layer 214 is a GaN layer epitaxially grown on AN layer 213 and functions as a channel layer. The band gap of GaN channel layer 214 is smaller than that of AlGaN barrier layer 212. GaN channel layer 214 has a back surface 214a in contact with front surface 213b of AlN layer 213, and back surface 214a is a Ga-polar surface. GaN channel layer 214 has a front surface 214b opposite to AlGaN barrier layer 212 (i.e. opposite to substrate 201), and front surface 214b is an N-polar surface. Front surface 214b constitutes a front surface 210b of semiconductor layer 210 opposite to substrate 201. The thickness of GaN channel layer 214 is, for example, 5 nm to 15 nm, and 9 nm in one embodiment. A strain is generated between GaN channel layer 214 and AlGaN barrier layer 212 due to a difference in lattice constant therebetween, and this strain induces a piezoelectric charge at an interface therebetween. As a result, two dimensional electron gas (2DEG) is generated in a region near AlGaN barrier layer 212 in GaN channel layer 214, and a channel region 214c is formed. The conductivity type of GaN channel layer 214 is, for example, n-type or undoped (i-type). Front surface 210b is an example of a second surface.

Semiconductor device 200 further includes a pair of GaN regions 222 (a source region and a drain region). The pair of GaN regions 222 are embedded in semiconductor layer 210 and disposed side by side in one direction along front surface 201a of substrate 201. Specifically, GaN regions 222 are disposed on front surface 213b of AlN layer 213, and are disposed side by side at positions sandwiching a part of GaN channel layer 214 in the one direction. The pair of GaN regions 222 fill the pair of recesses 221 formed in semiconductor layer 210. The pair of recesses 221 extend from front surface 210b of semiconductor layer 210 (front surface 214b of GaN channel layer 214) through GaN channel layer 214 to front surface 213b of AlN layer 213. Accordingly, Front surface 213b constitutes the bottom surface of each recess 221. Each GaN region 222 embedded in each recess 221 is in contact with front surface 213b and channel region 214c in GaN channel layer 214. Each recess 221 is formed by etching semiconductor layer 210.

GaN region 222 is a region epitaxially grown on front surface 213b of AlN layer 213. GaN region 222 is disposed to reduce a resistance value between source electrode 232 or drain electrode 233 disposed on GaN region 222 and channel region 214c. GaN region 222 is, for example, an n-type GaN layer doped at a high concentration of $1 \times 10^{18}$ cm$^{-3}$ to $1 \times 10^{21}$ cm$^{-3}$. The impurity concentration of GaN region 222 is higher than that of GaN channel layer 214 and that of AlGaN barrier layer 212. GaN region 222 has a front surface 222a opposite to AlN layer 213 (opposite to substrate 201). Front surface 222a is disposed at a position higher than front surface 210b of semiconductor layer 210 with reference to front surface 201a of substrate 201. That is, the thickness of GaN region 222 is thicker than that of GaN channel layer 214 and protrudes from front surface 214b of GaN channel layer 214.

Source electrode 232 is disposed on front surface 222a of one GaN region 222 (a source region). Drain electrode 233 is disposed on front surface 222a of the other GaN region 222 (a drain region). Source electrode 232 forms an ohmic contact with one GaN region 222. Drain electrode 233 forms an ohmic contact with the other GaN region 222. Source electrode 232 and drain electrode 233 which are ohmic electrodes are formed by alloying a stacked structure of, for example, a Ti (titanium) layer or a Ta (tantalum) layer and an Al (aluminum) layer. Source electrode 232 and drain electrode 233 may be formed by further stacking another Ti layer (or a Ta layer) on the Al layer and then alloying the stacked layers.

SiN layer 241 is disposed on front surface 210b of semiconductor layer 210. SiN layer 241 is in contact with front surface 210b and covers front surface 210b. SiN layer 241 has a pair of openings 241a. Each opening 241a corresponds to each recess 221, and GaN region 222 is disposed in each opening 241a. In this embodiment, with reference to front surface 201a of substrate 201, front surface 222a of each GaN region 222 is higher than front surface of SiN layer 241 opposite to substrate 201, and each GaN region 222 protrudes from front surface of SiN layer 241.

Gate electrode 231 is disposed above front surface 210b of semiconductor layer 210. Gate electrode 231 is disposed on SiN layer 241, and is disposed between source electrode 232 and drain electrode 233 in one direction along front surface 201a of substrate 201. Gate electrode 231 has, for example, a stacked structure of a Ni (nickel) layer, a Pd (palladium) layer, and an Au (gold) layer. SiN layer 241 may have an opening at the position of gate electrode 231. Gate electrode 231 may contact front surface 210b through the opening.

Insulating layer 242 is a protective layer covering gate electrode 231 and semiconductor layer 210. Insulating layer 242 is made of a Si-containing insulating material and is, for example, a SiN layer, a SiO2 layer, or a SiON layer. Insulating layer 242 has a pair of openings 242a. Source electrode 232 is exposed from one opening 242a. Drain electrode 233 is exposed from the other opening 242a. Wiring (not illustrated) connected to source electrode 232 is disposed in one opening 242a, and wiring (not illustrated) connected to drain electrode 233 is disposed in the other opening 242a.

Figure 6:
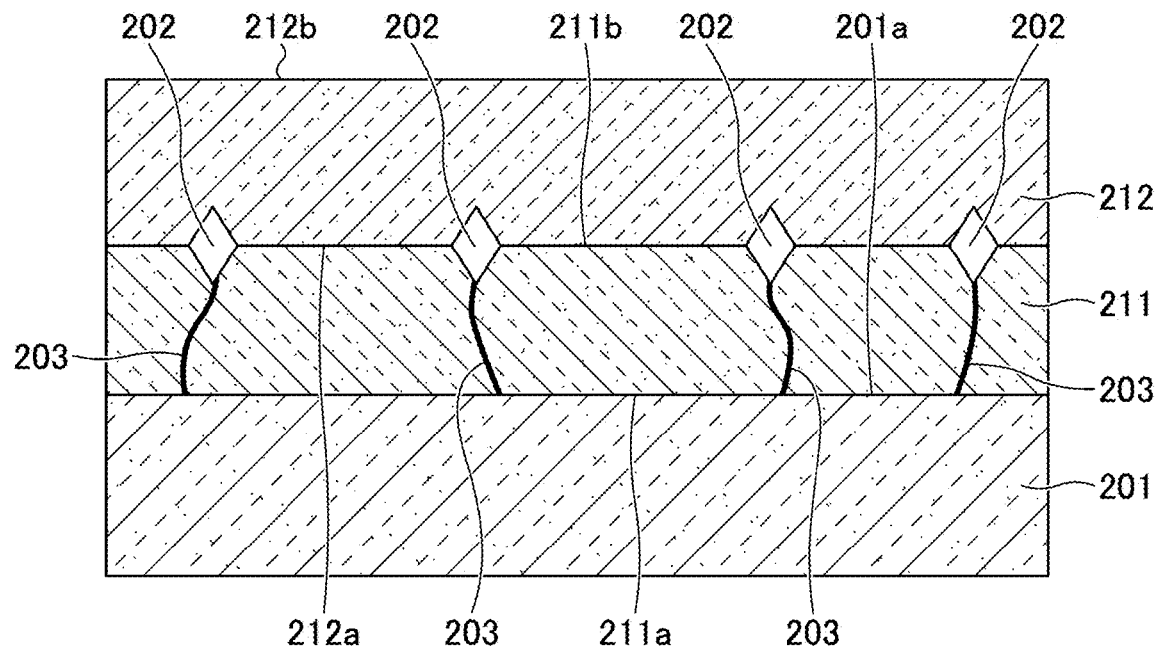
FIG. 6 is a cross-sectional view for illustrating a vicinity of an interface between a buffer layer and a barrier layer in the second embodiment.

An interface between buffer layer 211 and AlGaN barrier layer 212 will be described. FIG. 6 is a cross-sectional view illustrating a vicinity of the interface between the buffer layer and the barrier layer in the second embodiment.

As illustrated in FIG. 6, buffer layer 211 may include a dislocation 203. A density of dislocations 203 on front surface 211b of buffer layer 211 is, for example, about $1 \times 10^8$ cm$^{-2}$ to $1 \times 10^{12}$ cm$^{-2}$. Dislocation 203 is, for example, a screw dislocation, an edge dislocation, or a mixed dislocation.

A void 202 is formed between buffer layer 211 and AlGaN barrier layer 212. A plurality of voids 202 may be formed. Void 202 is connected to any of dislocations 203. Dislocations 203 connected to voids 202 are mainly screw dislocations or mixed dislocations. Some voids 202 may be connected to a screw dislocation, and some other voids 202 may be connected to a mixed dislocation. Further some other voids 202 may be connected to an edge dislocation.

The density of dislocation in front surface 212b and back surface 212a of AlGaN barrier layer 212 are lower than that of dislocation densities 203 in front surface 211b, for example, $1\times10^7$ cm$^{-2}$ or less, and preferably, AlGaN barrier layer 212 does not substantially include dislocations.

Next, a method for manufacturing the semiconductor device according to the second embodiment will be described. FIGS. 7 to 13 are cross-sectional views illustrating the method for manufacturing the semiconductor device according to the second embodiment.

Figure 7:
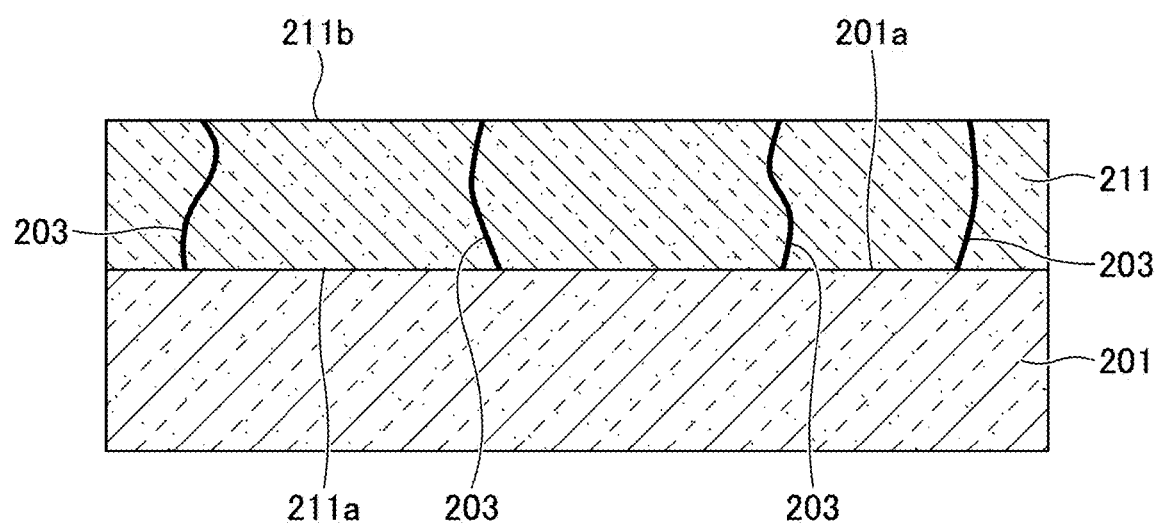
FIG. 7 is a first cross-sectional view for illustrating the method for manufacturing the semiconductor device according to the second embodiment.

First, as illustrated in FIG. 7, buffer layer 211 is formed on front surface 201a of substrate 201 by, for example, a MOCVD method. Source gases of buffer layer 211 are, for example, TMA and NH$_3$. Dislocation 203 is inevitably included in buffer layer 211 due to the influence of crystal mismatch or the like with substrate 201.

Figure 8:
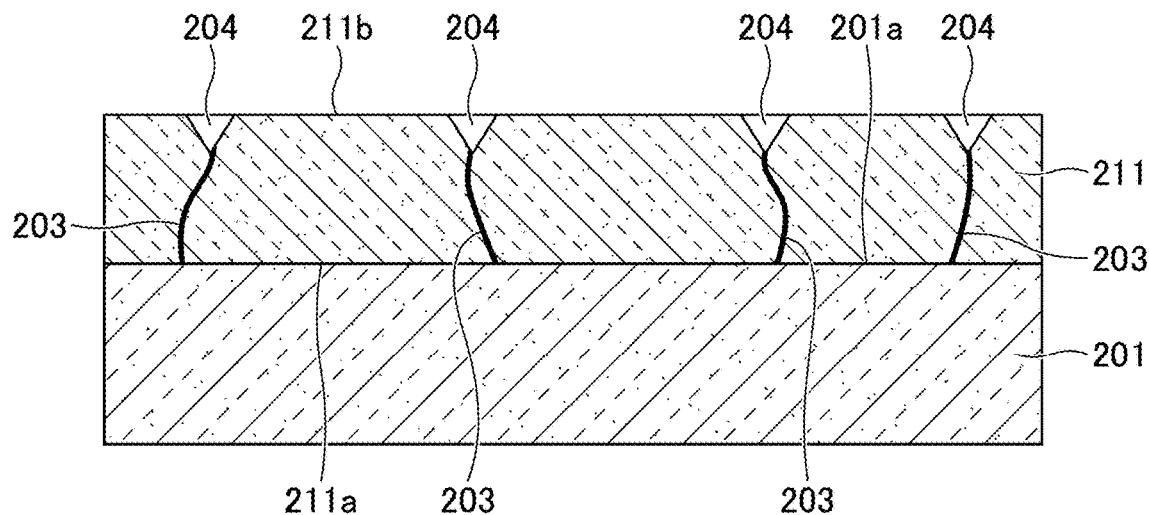
FIG. 8 is a second cross-sectional view for illustrating the method for manufacturing the semiconductor device according to the second embodiment.

Next, as illustrated in FIG. 8, front surface 211b of buffer layer 211 is etched to form an etch pit 204 in a part exposed to front surface 211b of dislocation 203. In this etching, for example, the temperature of substrate 201 and buffer layer 211 is set to 1000° C. or higher, and an etchant containing a Cl$_2$ gas is used. For example, Cl$_2$ gas diluted with N$_2$ gas may be used as the etchant.

Figure 9:
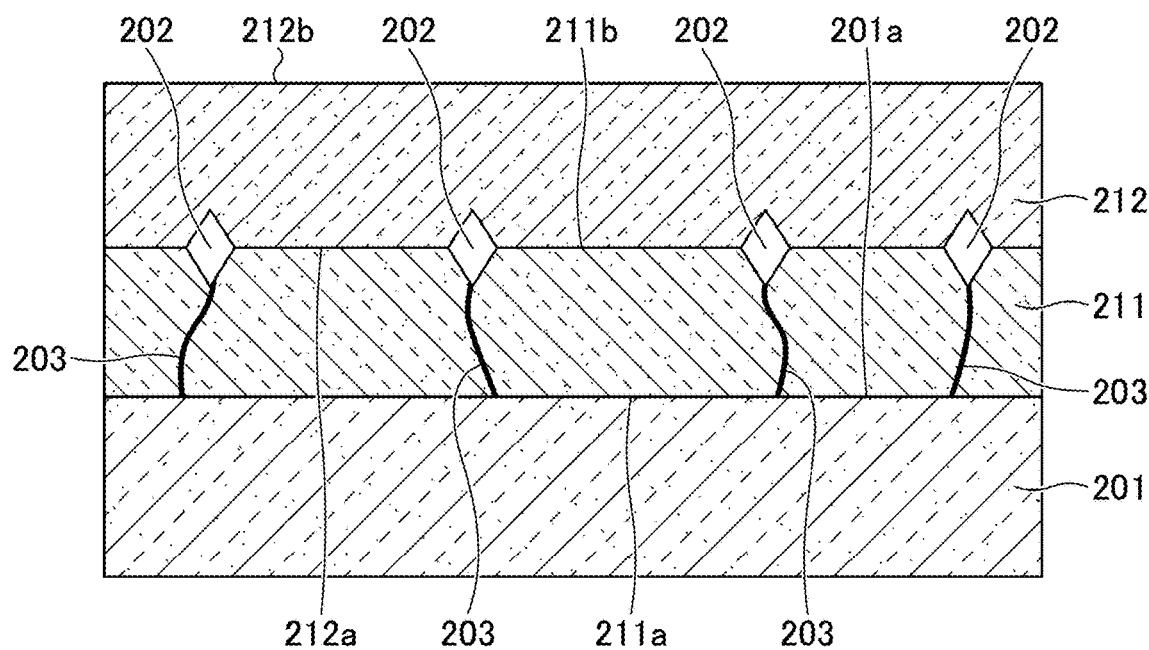
FIG. 9 is a third cross-sectional view for illustrating the method for manufacturing the semiconductor device according to the second embodiment.

Next, as illustrated in FIG. 9, AlGaN barrier layer 212 is grown on front surface 211b of buffer layer 211. Source gases of AlGaN barrier layer 212 are, for example, TMA, TMG, and NH$_3$. The growth temperature of AlGaN barrier layer 212 is, for example, 1050° C. AlGaN barrier layer 212 is preferentially grown from the periphery of etch pit 204. Further, AlGaN barrier layer 212 grows not only in the thickness direction (vertical direction) of buffer layer 211 but also in the direction parallel to front surface 211b (horizontal direction). Therefore, AlGaN barrier layer 212 is grown while forming void 202 including etch pit 204 between buffer layer 211 and AlGaN barrier layer 212.

Figure 10:
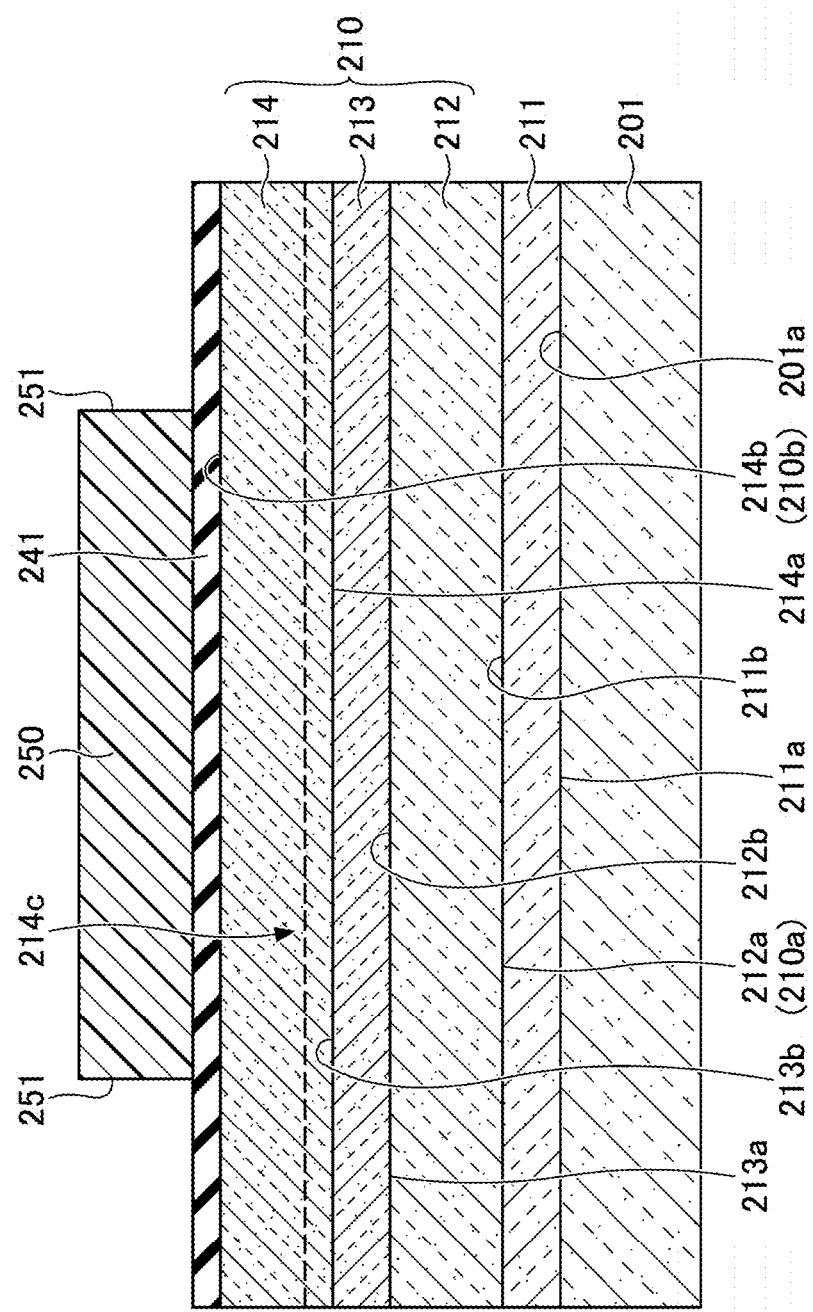
FIG. 10 is a fourth cross-sectional view for illustrating the method for manufacturing the semiconductor device according to the second embodiment.

Next, as illustrated in FIG. 10, AlN layer 213 is grown on AlGaN barrier layer 212. Source gases of AlN layer 213 are, for example, TMA and NH$_3$. The growth temperature of AlN layer 213 is, for example, 1100° C. Next, GaN channel layer 214 is grown on AlN layer 213. Source gases of GaN channel layer 214 are, for example, TMG and NH$_3$. The growth temperature of GaN channel layer 214 is, for example, 1050° C. In this way, semiconductor layer 210 including AlGaN barrier layer 212, AlN layer 213, and GaN channel layer 214 is formed.

Subsequently, SiN layer 241 in contact with front surface 210b of semiconductor layer 210 is formed by a low-pressure CVD method or a plasma CVD method. In the case of using a low-pressure CVD method, the film deposition temperature is, for example, 600° C. to 850° C., and the film deposition pressure is, for example, from 10 Pa to 50 Pa. SiN layer 241 deposited by a low pressure CVD method is a dense and hard film as compared with the case of being deposited by a plasma CVD method. NH$_3$ and SiH$_2$Cl$_2$ (dichlorosilane), for example, are used as source gases for the deposition by a low-pressure CVD method.

Figure 11:
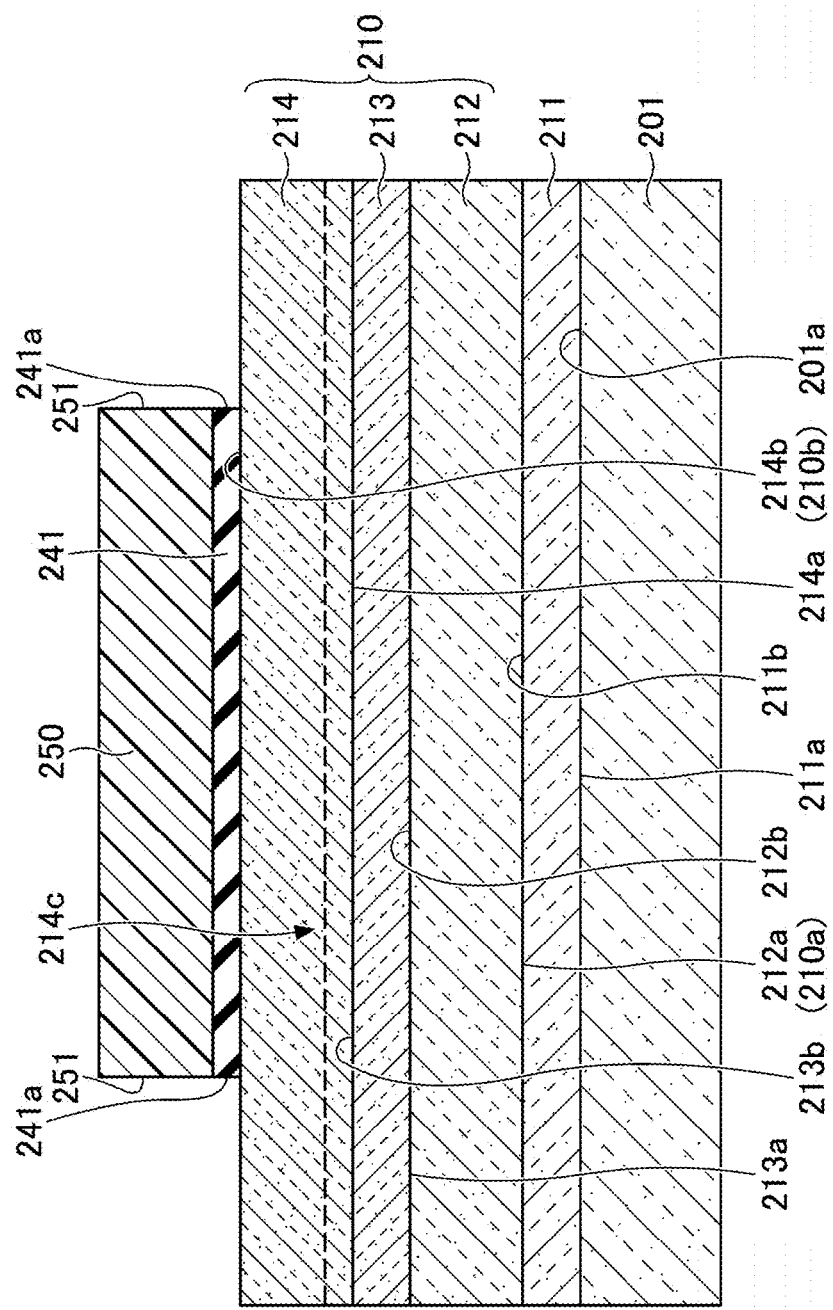
FIG. 11 is a fifth cross-sectional view for illustrating the method for manufacturing the semiconductor device according to the second embodiment.

Subsequently, a mask 250 having an opening 251 is formed on SiN layer 241. At this time, opening 251 of mask 250 is formed in a region corresponding to the pair of recesses 221 (see FIG. 5). Therefore, the planar shape of opening 251 matches the planar shape of recess 221. After mask 250 is formed on SiN layer 241, SiN layer 241 is etched through opening 251 of mask 250. The etching is, for example, reactive ion etching (RIE) using a fluorine-based gas. By this etching, as illustrated in FIG. 11, opening 241a for exposing front surface 210b of semiconductor layer 210 is formed in SiN layer 241.

Figure 12:
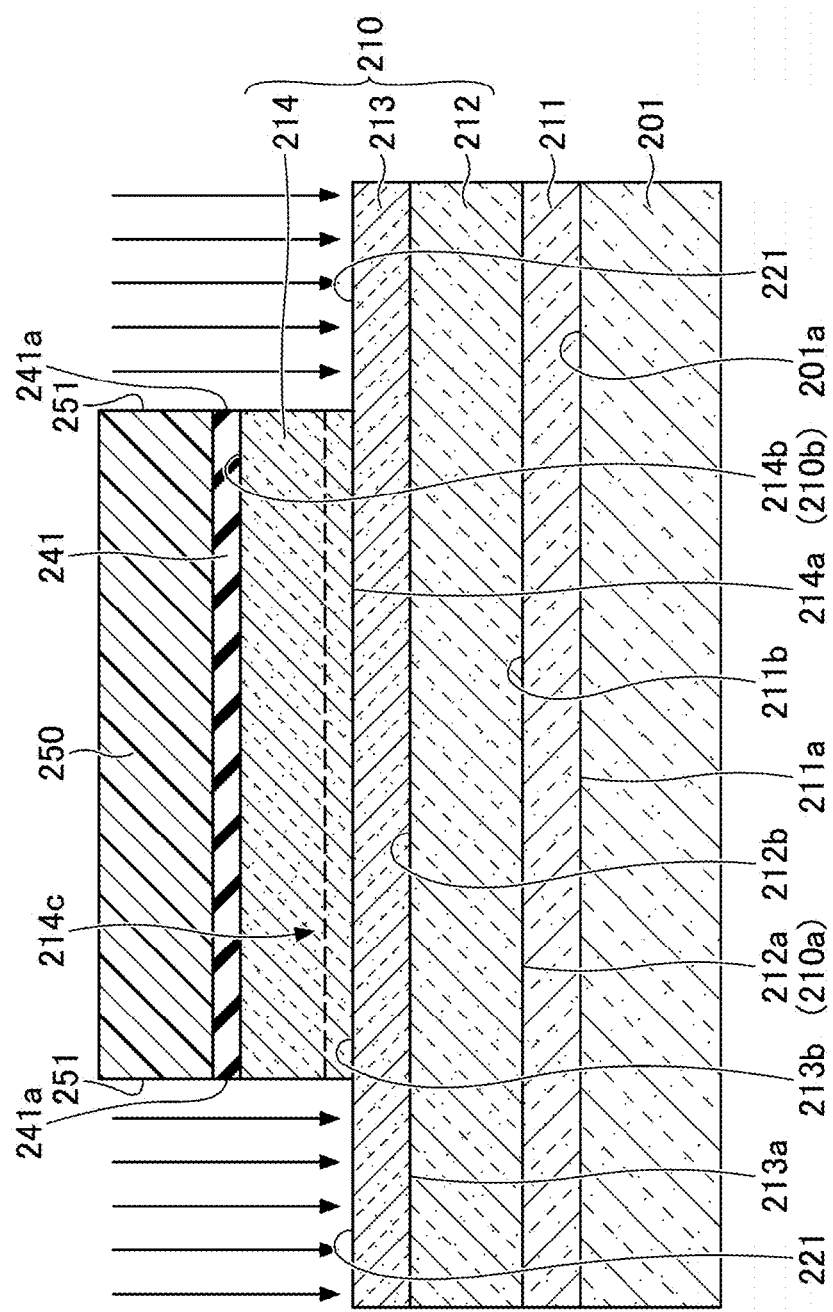
FIG. 12 is a sixth cross-sectional view for illustrating the method for manufacturing the semiconductor device according to the second embodiment.

Subsequently, as illustrated in FIG. 12, recess 221 is formed in semiconductor layer 210 by etching through opening 251 of mask 250. In this etching, for example, BCl$_3$ or SiCl$_4$ is used as an etchant.

Figure 13:
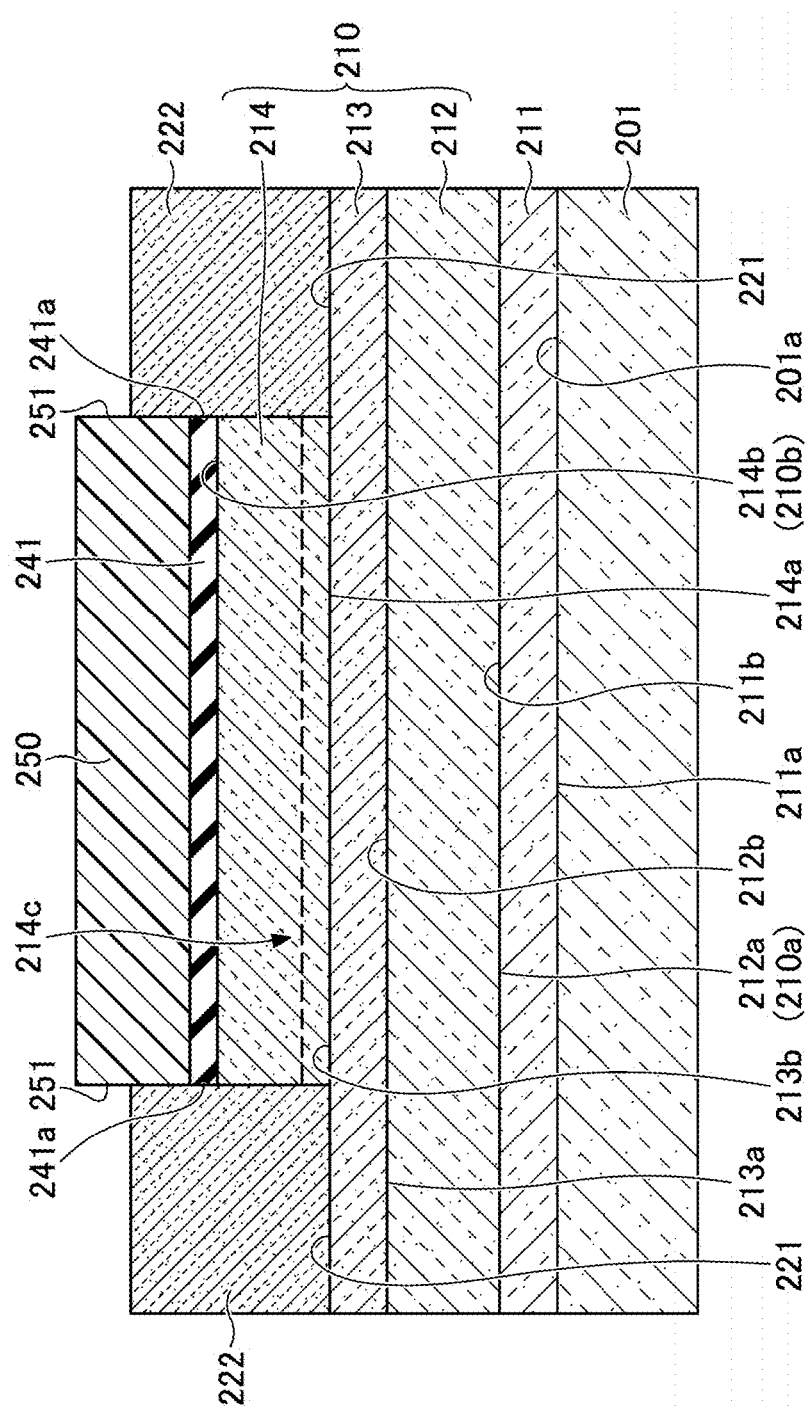
FIG. 13 is a seventh cross-sectional view for illustrating the method for manufacturing the semiconductor device according to the second embodiment.

Subsequently, as illustrated in FIG. 13, GaN region 222 is regrown in recess 221. In this embodiment, for example, GaN region 222 is epitaxially grown on the bottom surface of recess 221 (i.e. on front surface 213b of AlN layer 213) by sputtering, MOCVD, a molecular beam epitaxy (MBE), or the like. The n-type dopant is, for example, Si, in which case the doping source is SiH$_4$ (silane).

Subsequently, source electrode 232 and drain electrode 233 illustrated in FIG. 5 are formed on front surface 222a of each GaN region 222. In the formation of source electrode 232 and drain electrode 233, at first, a plurality of metal layers (for example, Ta/Al/Ta or Ti/Al/Ti) constituting source electrode 232 and drain electrode 233 are sequentially deposited to form a structure. Thereafter, the stacked structure is subjected to heat treatment to be alloyed. The temperature of the heat treatment is, for example, 500° C. to 600° C. Next, gate electrode 231 is formed on SiN layer 241 between source electrode 232 and drain electrode 233. In the formation of gate electrode 231, a plurality of metal layers (for example, Ni/Pd/Au) constituting gate electrode 231 are sequentially deposited to form a stacked structure.

Subsequently, insulating layer 242 is formed on SiN layer 241 by, for example, a plasma CVD method, and gate electrode 231 is covered with insulating layer 242. Thereafter, the pair of openings 242a are formed in insulating layer 242 by, for example, RIE using a fluorine-based gas, and source electrode 232 and drain electrode 233 are exposed from the respective openings 242a.

In this manner, semiconductor device 200 according to the second embodiment is manufactured. Thereafter, if necessary, a source wiring and a drain wiring are formed on source electrode 232 and drain electrode 233, respectively.

In the second embodiment, since void 202 is formed between buffer layer 211 and AlGaN barrier layer 212, even if dislocation 203 is included in buffer layer 211, the propagation of dislocation 203 to AlGaN barrier layer 212 can be suppressed. Therefore, the crystallinity of semiconductor layer 210 including AlGaN barrier layer 212 is improved, and the formation of hillocks on front surface 212b of AlGaN barrier layer 212, front surface 213b of AlN layer 213, and front surface 214b of GaN channel layer 214 can be suppressed.

Further, semiconductor layer 210 includes AlGaN barrier layer 212 disposed on buffer layer 211 and GaN channel layer 214 disposed above AlGaN barrier layer 212. For this reason, in the reverse HEMT, source electrode 232 and drain electrode 233 are easily provided in the vicinity of channel region 214c in GaN channel layer 214, and the resistance between source electrode 232 and drain electrode 233 and channel region 214c is easily reduced.

In manufacturing semiconductor device 200, buffer layer 211 is an AlN layer, and an etchant containing a Cl$_2$ gas is used when etching the front surface of buffer layer 211, so that etch pit 204 is easily formed.

Figure 14:
FIG. 14 is a diagram illustrating a front surface of a first sample.

Here, the result of the front surface observation of the sample (first sample) of the multilayer semiconductor structure manufactured according to the first embodiment will be described together with the result of the front surface observation of the sample (second sample) of the multilayer semiconductor structure of the reference example. This front surface observation was performed using a scanning electron microscope (SEM). In the second sample, a semiconductor layer was formed without forming an etch pit after forming a buffer layer. In both the first sample and the second sample, the substrate is a SiC substrate, the buffer layer is an AlN layer, and the semiconductor layer is a GaN layer. FIG. 14 is a view illustrating the front surface of the first sample, and FIG. 15 is a view illustrating the front surface of the second sample.

Figure 15:
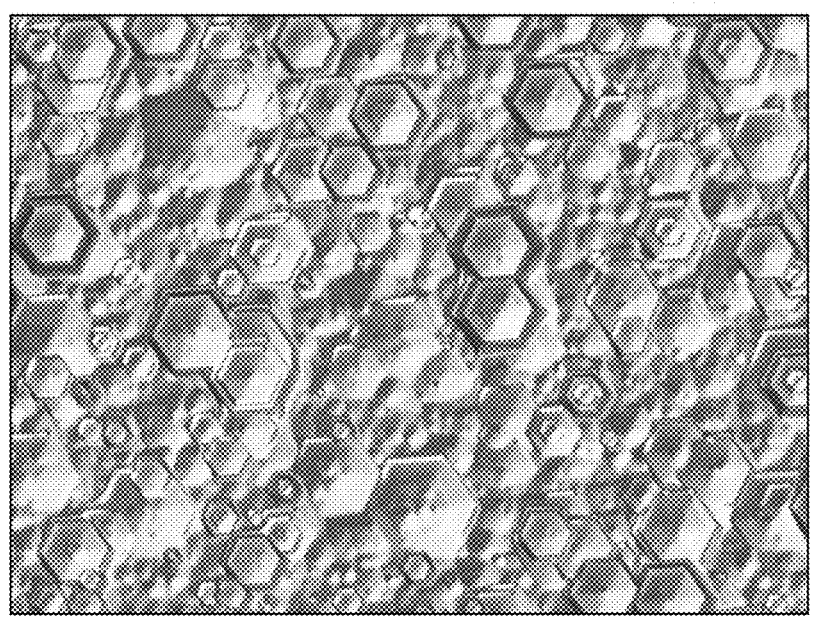
FIG. 15 is a view illustrating a front surface of a second sample.

As illustrated in FIGS. 14 and 15, many hillocks having a regular hexagonal planar shape were observed in the second sample, whereas no hillock was observed in the first sample.

The process for forming the etch pit on the front surface of the buffer layer is not limited to a dry process, and the etch pit may be formed by a wet process. For example, the formation of the buffer layer may be performed in a semiconductor layer growth furnace (for example, MOCVD), the substrate on which the buffer layer is formed may be taken out from the growth furnace, and an etch pit may be formed by wet processing.

In addition, a semiconductor device using a multilayer semiconductor structure is not limited to a transistor, and for example, a light-emitting diode may be formed using a multilayer semiconductor structure.

Whether the dislocation is a screw dislocation, an edge dislocation, or a mixed dislocation can be identified by observation using a transmission electron microscope (TEM). That is, a dislocation line and a Burgers vector are specified by TEM observation, and if they are parallel to each other, they are screw dislocations, if they are perpendicular to each other, they are edge dislocations, and if they are neither parallel nor perpendicular to each other, they are mixed dislocations.

Although the embodiment has been described above in detail, the present disclosure is not limited to the specific embodiment, and various modifications and changes can be made within the scope described in the claims.

What is claimed is:

1. A multilayer semiconductor structure comprising:
    a substrate;
    a buffer layer disposed on the substrate, the buffer layer having a front surface and a back surface, the back surface facing the substrate; and
    a semiconductor layer disposed on the front surface of the buffer layer,
    wherein the buffer layer includes a dislocation extending from the back surface toward the front surface; the multilayer semiconductor structure further comprising:
    a void being an empty space enclosed by the buffer layer and the semiconductor layer, the void having an upper portion and a lower portion in a cross-sectional view of the multilayer semiconductor structure, the upper portion being included in the semiconductor layer and directly facing the semiconductor layer, the lower portion being included in the buffer layer and directly facing the buffer layer, the lower portion being directly connected to the dislocation, wherein the upper portion of the void has a first triangular shape having two sides and a vertex in the cross-sectional view, the two sides each extending from the lower portion and intersecting with each other at the vertex, the vertex being apart from the lower portion and included in the semiconductor layer, and
    the lower portion of the void has a second triangular shape in the cross-sectional view.

2. The multilayer semiconductor structure according to claim 1, wherein the dislocation is a screw dislocation or a mixed dislocation.

3. The multilayer semiconductor structure according to claim 1, wherein the buffer layer is an AlN layer.

4. The multilayer semiconductor structure according to claim 1, wherein
    the semiconductor layer includes a nitride semiconductor layer having a first surface facing the substrate and a second surface opposite to the first surface, and
    the second surface is N-polar.

5. A semiconductor device comprising:
    the multilayer semiconductor structure according to claim 1; and
    gate, source, and drain electrodes formed on the multilayer semiconductor structure.

6. The semiconductor device according to claim 5, wherein the semiconductor layer includes:
    a barrier layer disposed on the buffer layer; and
    a channel layer disposed above the barrier layer.

7. The multilayer semiconductor structure according to claim 1, wherein the first triangular shape and the second triangular shape form a quadrangular shape in the cross-sectional view of the multilayer semiconductor structure.

8. The multilayer semiconductor structure according to claim 1, wherein a width of the void is at its maximum at an interface of the buffer layer and the semiconductor layer in the cross-sectional view.

* * * * *